United States Patent
Ueno (10) Patent No.: US 8,319,512 B2
(45) Date of Patent: Nov. 27, 2012

(54) FLEXIBLE SUBSTRATE INCLUDING INSPECTION ELECTRODE FOR OUTPUTTING SIGNAL PROCESSED IN INTEGRATED CIRCUIT, ELECTRO-OPTICAL DEVICE, AND ELECTRONIC DEVICE

(75) Inventor: Katsutoshi Ueno, Chino (JP)

(73) Assignee: Seiko Epson Corporation, Tokyo (JP)

( * ) Notice: Subject to any disclaimer, the term of this patent is extended or adjusted under 35 U.S.C. 154(b) by 329 days.

(21) Appl. No.: 12/722,826

(22) Filed: Mar. 12, 2010

(65) Prior Publication Data

US 2010/0237892 A1 Sep. 23, 2010

(30) Foreign Application Priority Data

Mar. 23, 2009 (JP) ................................. 2009-069825

(51) Int. Cl.
  *G01R 31/26* (2006.01)
(52) U.S. Cl. ................................. 324/760.01
(58) Field of Classification Search .................. None
See application file for complete search history.

(56) References Cited

U.S. PATENT DOCUMENTS

| | | | |
|---|---|---|---|
| 5,483,173 A * | 1/1996 | Pellegrini | 324/762.02 |
| 6,319,019 B1 * | 11/2001 | Kwon et al. | 439/67 |
| 7,432,451 B2 * | 10/2008 | Yamada | 174/260 |
| 2005/0041488 A1 | 2/2005 | Ito et al. | |
| 2008/0158181 A1 * | 7/2008 | Hamblin et al. | 345/173 |

FOREIGN PATENT DOCUMENTS

| | | | |
|---|---|---|---|
| JP | 02004252331 A | * | 9/2004 |
| JP | 2005-43418 A | | 2/2005 |

\* cited by examiner

*Primary Examiner* — Vinh Nguyen (74) *Attorney, Agent, or Firm* — AdvantEdge Law Group, LLC (57) ABSTRACT

A flexible substrate includes a substrate body; a plurality of lines that are arranged on the substrate body; a plurality of connection terminals that are arranged on an end portion of the substrate body and electrically connected to the respective lines; an integrated circuit that is arranged on the substrate body and electrically connected to at least one of the lines; and an inspection electrode that is arranged on the substrate body and electrically connected to the integrated circuit and capable of outputting a signal processed in the integrated circuit.

12 Claims, 6 Drawing Sheets

FLEXIBLE SUBSTRATE INCLUDING INSPECTION ELECTRODE FOR OUTPUTTING SIGNAL PROCESSED IN INTEGRATED CIRCUIT, ELECTRO-OPTICAL DEVICE, AND ELECTRONIC DEVICE

BACKGROUND

1. Technical Field

The present invention relates to a flexible substrate that is to be connected to a liquid crystal device or the like, a electro-optical device having the flexible substrate, and an electronic device (such as a liquid crystal projector) having the electro-optical device.

2. Related Art

A flexible substrate of this type connects a liquid crystal panel to an external circuit, for example. The flexible substrate of this type has various advantages. Specifically, the flexible substrate is capable of including many lines in a small space and being connected to an external circuit by means of a connector. An integrated circuit may be formed on the flexible substrate to drive the liquid crystal panel connected to the flexible substrate (refer to JP-A-2005-43418, for example).

The integrated circuit formed on the flexible substrate is inspected, for example, by monitoring a signal processed in the integrated circuit. If a terminal is provided on the liquid crystal panel in order to monitor the signal, the number of terminals that connect the flexible substrate to the liquid crystal panel is increased. As a result, the configuration of a device including the flexible substrate may become complicated. In addition, the terminal provided on the liquid crystal panel cannot monitor a signal (that is not output from the flexible substrate) used only for internal processing of the integrated circuit. That is, the aforementioned technique has a problem that a signal may not be appropriately monitored.

SUMMARY

An advantage of some aspects of the invention is that it provides a flexible substrate, an electro-optical device and an electronic device, which are capable of appropriately monitoring a signal processed in an integrated circuit formed on the flexible substrate.

According to an aspect of the invention, a flexible substrate includes: a substrate body; a plurality of lines that are arranged on the substrate body; a plurality of connection terminals that are arranged on an end portion of the substrate body and electrically connected to the respective lines; an integrated circuit that is arranged on the substrate body and electrically connected to at least one of the lines; and an inspection electrode that is arranged on the substrate body and electrically connected to the integrated circuit and capable of outputting a signal processed in the integrated circuit.

In this case, the substrate body included in the flexible substrate is a resin film, a plastic film or the like, which is capable of being bent. The lines are electrically connected to the respective connection terminals. Each connection terminal allows a signal to be input to and output from the flexible substrate. A pair of the connection terminals is typically connected to respective ends of each line.

The integrated circuit electrically connected to at least one of the lines is formed on the flexible substrate. It is not necessary that the integrated circuit be electrically connected to all the lines. The integrated circuit includes a driving circuit that drives an electro-optical panel that is connected to the flexible substrate. The integrated circuit performs various types of processing (such as conversion, correction, and synchronization) on an input signal.

The inspection electrode formed on the flexible substrate outputs signals processed in the integrated circuit. The signals processed in the integrated circuit include signals that are to be output from the flexible substrate through the lines and the connection terminals. In addition, the signals processed in the integrated circuit include a signal used only for internal processing of the integrated circuit.

The inspection electrode is formed on the flexible substrate and exposed to the outside of the flexible substrate. The inspection electrode is electrically connected to the integrated circuit through a line (other than the aforementioned plurality of lines) extending from a terminal included in the integrated circuit. A plurality of the inspection electrodes may be formed on the flexible substrate. The inspection electrode is typically formed on the surface (on which the integrated circuit is formed) of the flexible substrate. The inspection electrode may be formed on the other surface (opposite to the surface on which the integrated circuit is formed) of the flexible substrate. A reading probe or the like comes into contact with the inspection electrode to read a signal output from the inspection electrode.

Since the inspection electrode is located on the flexible substrate, it is not necessary that a similar electrode be provided outside the flexible substrate. Thus, the number of the connection terminals included in the flexible substrate is not increased. This configuration is effective when a layout of lines or a pitch of connection terminals is restricted in order to reduce the size of the flexible substrate. A signal that is not output from the flexible substrate, or a signal used only for the internal processing of the integrated circuit, can be monitored. In other words, a signal that cannot be monitored by a similar inspection terminal provided outside the flexible substrate cab be monitored.

As described above, the signal processed in the integrated circuit formed on the flexible substrate can be appropriately monitored.

It is preferable that the inspection electrode output a signal that is not input to or output from the integrated circuit through the connection terminals.

In this case, the inspection electrode outputs a signal (that is not input to the flexible substrate from the outside of the flexible substrate, or is not output from the flexible substrate) that is not input to or output from the integrated circuit through the connection terminals. Signals output from the inspection electrode are not directly used to control a device connected to the flexible substrate. The signals output from the inspection electrode include a signal used only for the internal processing of the integrated circuit.

In this case, the inspection electrode is capable of monitoring a signal that cannot be monitored by a device that is provided outside the flexible substrate. Even if a similar inspection terminal is provided outside the flexible substrate, the inspection terminal cannot monitor the signal. However, the inspection electrode is capable of appropriately monitoring the signal.

It is preferable that the flexible substrate further include a first switching section that switches operations of the inspection electrode to cause the inspection electrode to output or not to output the signal processed in the integrated circuit.

In this case, the first switching section is capable of switching the operations of the inspection electrode to cause the inspection electrode to output or not to output the signal (or is capable of switching operations of the integrated circuit to cause the integrated circuit to output or not to output the signal). The inspection electrode is capable of outputting a signal only when the signal needs to be monitored. In such a case, power consumption of the inspection electrode can be reduced.

The switching operation by the first switching section may be manually performed. Alternatively, the switching operation by the first switching section may be automatically performed after requirements are set.

It is preferable that the flexible substrate further include a second switching section that switches the types of signals that are to be output from the inspection electrode.

In this case, since the second switching section is capable of switching the types of the signals that are to be output from the inspection electrode, signals of different types can be output from the inspection electrode even when the number of inspection electrodes provided on the flexible substrate is only one. Thus, many signals can be inspected regardless of the number of inspection electrodes. Therefore, a space on the flexible substrate can be efficiently used.

The switching operation by the second switching section may be manually performed. Alternatively, the switching operation by the second switching section may be automatically performed after requirements are set. The second switching section may have the function of the first switching section.

It is preferable that the flexible substrate further include an amplifier that amplifies the signal that is to be output from the inspection electrode.

In this case, the amplifier such as a buffer circuit amplifies the signal that is to be output from the inspection electrode. Thus, even when the signal has small amplitude, the amplifier amplifies the signal. The inspection electrode outputs the amplified signal having large amplitude. Thus, a signal that is difficult to be read without amplification can be reliably inspected.

The amplifier may be provided in the integrated circuit. Alternatively, the amplifier may be provided between the integrated circuit and the inspection electrode.

It is preferable that the inspection electrode have a width larger than the width of each of the lines.

In this case, a signal can be more easily read from the inspection electrode than reading of signals from the lines that are formed on the flexible substrate and exposed to the outside of the flexible substrate. Specifically, a reading probe or the like easily comes into contact with the inspection electrode. Therefore, the signal can be appropriately monitored.

The inspection electrode may have a shape that fits the reading probe or the like, while the width of the inspection electrode is large. In this case, a signal can be more easily read from the inspection electrode.

To solve the aforementioned problem, the electro-optical device includes the flexible substrate and the electro-optical panel that is electrically connected to the flexible substrate through the connection terminals.

In this case, the integrated circuit formed on the flexible substrate drives a part or the whole of the electro-optical panel.

Since the signal processed in the integrated circuit can be appropriately monitored, the electro-optical device can be appropriately manufactured.

To solve the aforementioned problem, the electronic device includes the electro-optical device.

In this case, the electronic device may be any of the following devices: a projection-type display device; a television; a mobile phone; an electronic device; a word processor; a viewfinder type video tape recorder; a monitor-direct-vision type video tape recorder; a work station; a video phone; a POS terminal; a device having a touch panel; and the like. The above devices can be easily manufactured and are highly reliable. In addition, the electronic device may be an electrophoresis device such as an electronic paper.

Effects and advantages of the invention will be apparent from the following embodiment of the invention.

BRIEF DESCRIPTION OF THE DRAWINGS

The invention will be described with reference to the accompanying drawings, wherein like numbers reference like elements.

DESCRIPTION OF EXEMPLARY
EMBODIMENTS

An embodiment of the invention is described below with reference to the accompanying drawings.
Electro-Optical Device First, an electro-optical device including a flexible substrate according to the invention is described with reference to FIGS. 1 to 4. In the embodiment, a built-in driving-circuit type thin film transistor (TFT) active matrix drive liquid crystal device is described as an example of the electro-optical device according to the invention.

Figure 1:
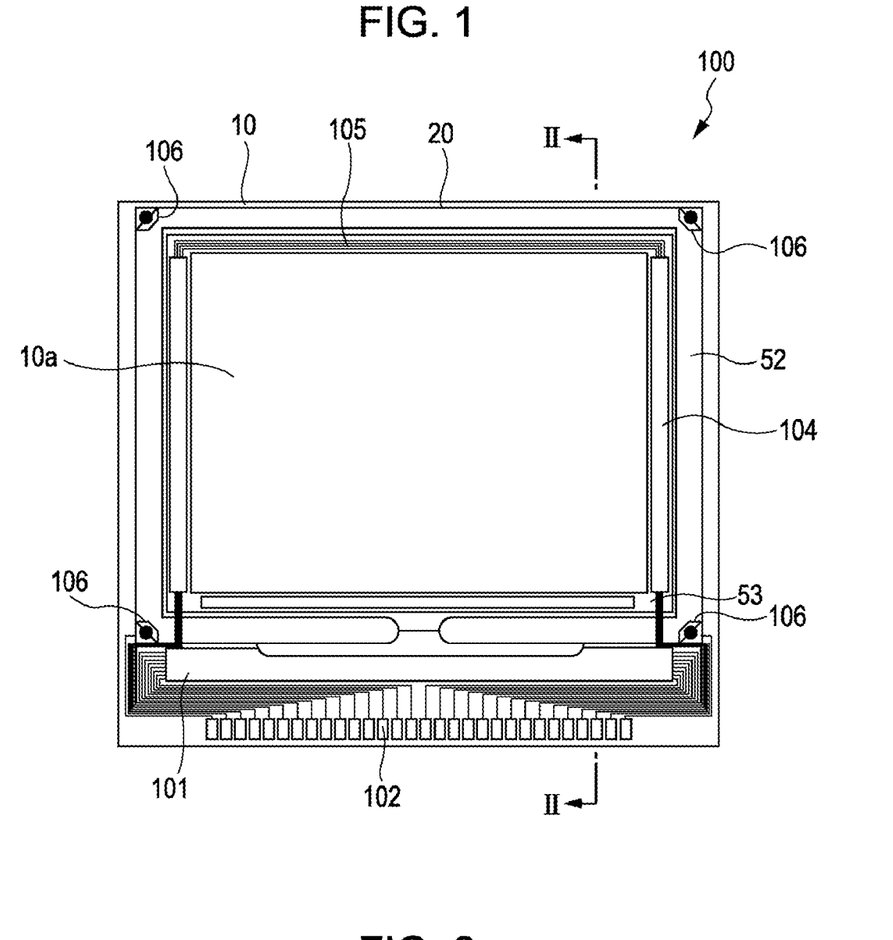
FIG. 1 is a plan view of an electro-optical panel according to an embodiment of the invention.
Figure 2:
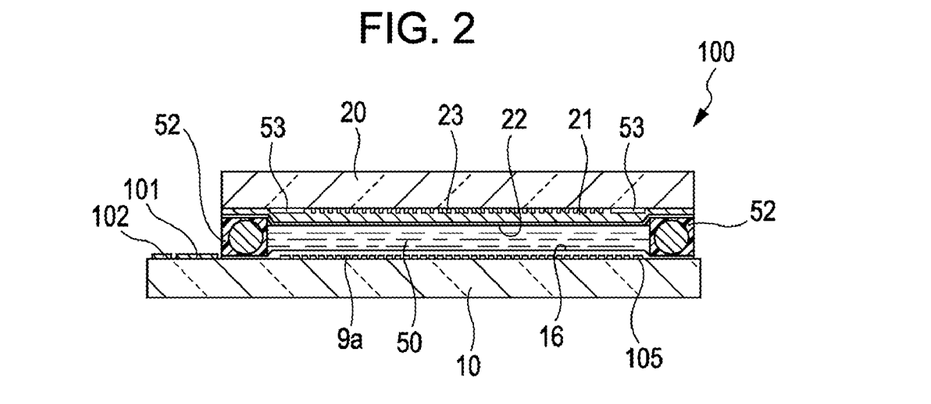
FIG. 2 is a cross sectional view of the electro-optical panel taken along a line II-II' of FIG. 1.

The configuration of an electro-optical panel included in the electro-optical device according to the embodiment is described with reference to FIGS. 1 and 2. FIG. 1 is a plan view of the electro-optical panel according to the embodiment. FIG. 2 is a cross sectional view of the electro-optical panel taken along a line II-II' of FIG. 1.

As shown in FIGS. 1 and 2, the electro-optical panel 100 according to the embodiment has a TFT array substrate 10 and an opposing substrate 20. The opposing substrate 20 is arranged opposite the TFT array substrate 10. The TFT array substrate 10 is a transparent substrate (such as a glass substrate or a quartz substrate), a silicon substrate or the like. The opposing substrate 20 is a transparent substrate (such as a glass substrate or a quartz substrate). A liquid crystal layer 50 is provided between the TFT array substrate 10 and the opposing substrate 20. The liquid crystal layer 50 includes a single type of or a plurality of types of nematic liquid crystal. Molecules of the nematic liquid crystal are oriented in a predetermined direction between a pair of alignment films.

The TFT array substrate 10 and the opposing substrate 20 are bonded to each other by means of a sealing member 52.

The sealing member 52 is included in a sealing region that surrounds an image display region 10a having a plurality of pixel electrodes 9a.

The sealing member 52 is made of ultraviolet curable resin, thermosetting resin or the like in order to bond the substrates 10 and 20 to each other. After the sealing member 52 is coated on the TFT array substrate 10 in a manufacturing process, the sealing member 52 is exposed to ultraviolet rays, or heated, or subjected to another process and thereby cured. The sealing member 52 includes a first gap member such as glass fibers or glass beads in order to set a gap between the TFT array substrate 10 and the opposing substrate 20 to a predetermined distance. A second gap member may be arranged in the image display region 10a or in a peripheral region located near the image display region 10a under the condition that the first gap member is included in the sealing member 52. Alternatively, the second gap member may be arranged in the image display region 10a or in the peripheral region located near the image display region 10a under the condition that the first gap member is not included in the sealing member 52.

The electro-optical panel 100 has a frame-shaped light shielding film 53 arranged on the side of the opposing substrate 20. The frame-shaped light shielding film 53 extends along an inner side of the sealing region and defines a frame-shaped region of the image display region 10a. The frame-shaped light shielding film 53 has a light shielding property. A part or the whole of the frame-shaped light shielding film 53 may be arranged on the side of the TFT array substrate 10 as a built-in light shielding film.

The electro-optical panel 100 has a data line driving circuit 101 and an external circuit connection terminal 102. The data line driving circuit 101 and the external circuit connection terminal 102 are provided in the peripheral region and on an outer side of the sealing region (in which the sealing member 52 is located). The data line driving circuit 101 and the external circuit connection terminal 102 are located along one side of the TFT array substrate 10. The electro-optical panel 100 has two scanning line driving circuits 104 that are respectively located along two other sides of the TFT array substrate 10. The two sides of the TFT array substrate 10 are adjacent to the aforementioned one side of the TFT array substrate 10. The scanning line driving circuits 104 are covered with the frame-shaped light shielding film 53. The electro-optical panel 100 has a plurality of lines 105 extending along the remaining side of the TFT array substrate 10 in order to connect the two scanning line driving circuits 104 (located on two sides of the image display region 10a) to each other. The lines 105 are covered with the frame-shaped light shielding film 53.

The electro-optical panel 100 has conductive terminals 106 that are provided above the TFT array substrate 10 and respectively arranged opposite four corner portions of the opposing substrate 20 in order to connect the substrates 10 and 20 to each other by means of conductive members. Thus, the TFT array substrate 10 is electrically connected to the opposing substrate 20.

As shown in FIG. 2, a multilayer structure is provided on the TFT array substrate 10. The multilayer structure is not illustrated in detail in FIG. 2. The multilayer structure includes TFTs 30 (driving elements) for pixel switching and lines (including scanning lines 3a and data lines 6a). The pixel electrodes 9a are provided on the TFT array substrate 10. The pixel electrodes 9a are provided for respective pixels included in the electro-optical panel 100. Each of the pixel electrodes 9a includes a transparent material containing indium tin oxide (ITO).

The pixel electrodes 9a are included in the image display region 10a and arranged on the TFT array substrate 10. The pixel electrodes 9a face opposing electrodes 21. One of the alignment films, which is denoted by reference numeral 16, is formed on the surface (located on the side of the liquid crystal layer 50) of the TFT array substrate 10, i.e., on the pixel electrodes 9a, and covers the pixel electrodes 9a.

A light shielding film 23 is formed on a surface of the opposing substrate 20, the surface of the opposing substrate 20 facing the TFT array substrate 10. The light shielding film 23 is formed in a lattice shape on the surface of the opposing substrate 20. The light shielding film 23 defines non-opening regions of the opposing substrate 20. The light shielding film 23 partitions the opposing substrate 20 into opening regions through which light emitted by a projector lamp, a direct-vision backlight or the like is transmitted. The light shielding film 23 may have a stripe-like shape so that the light shielding film 23 and elements (the data lines and the like) located on the side of the TFT array substrate 10 define the non-opening regions.

Each of the opposing electrodes 21 is formed on the light shielding film 23 and includes a transparent material containing ITO. The opposing electrodes 21 face the pixel electrodes 9a. In addition, a color filter (not shown in FIG. 2) may be formed on the light shielding film 23 and in a region including a part of each of the opening regions and a part of each of the non-opening regions in order to display a color image in the image display region 10a. The other alignment film, which is denoted by reference numeral 22, is formed on the opposing electrodes 21 located on the surface (facing the TFT array substrate 10) of the opposing substrate 20.

A sampling circuit, a precharge circuit, an inspection circuit and the like may be formed on the TFT array substrate 20, in addition to the data line driving circuit 101 and the scanning line driving circuits 104. In this case, the sampling circuit samples image signals supplied from image signal lines and then supplies the sampled signals to the data lines. The precharge circuit supplies precharge signals of predetermined voltage levels to the respective data lines before the image signals are supplied to the data lines. The inspection circuit inspects the electro-optical panel 100 to check the quality of the electro-optical panel 100 before completion or shipment of the electro-optical panel 100. If the electro-optical panel 100 has a defect, the inspection circuit also inspects the defect before completion or shipment of the electro-optical panel 100.

Figure 3:
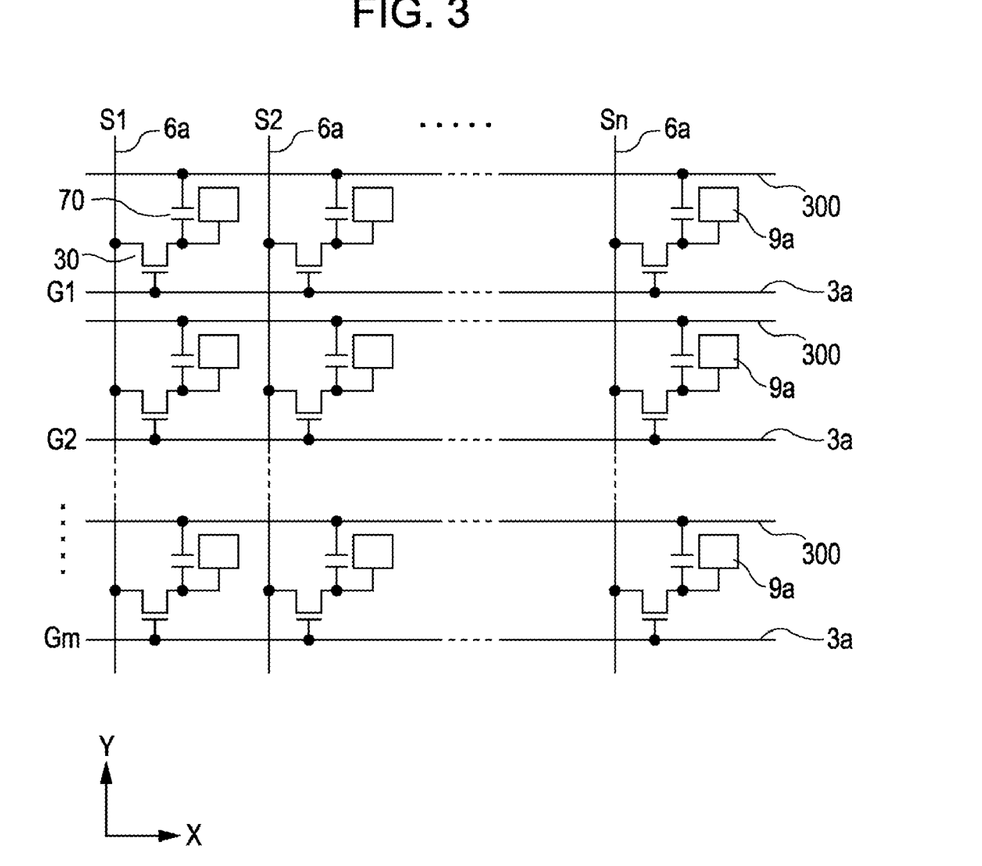
FIG. 3 is an equivalent circuit diagram showing elements, lines and the like that form an image display region of the electro-optical panel according to the embodiment.

Next, an electrical configuration of a pixel portion of the electro-optical panel according to the embodiment is described with reference to FIG. 3. FIG. 3 is an equivalent circuit diagram showing elements, lines and the like, which are provided for the pixels. The pixels are arranged in a matrix pattern and form the image display region 10a of the electro-optical panel 100 according to the embodiment.

In FIG. 3, the pixels that form the image display region 10a and are arranged in a matrix pattern include the respective image electrodes 9a and the respective TFTs 30. The TFTs 30 are electrically connected to the respective image electrodes 9a and control the respective image electrodes 9a to switch operations of the respective image electrodes 9a on/off. The data lines 6a, which receive the image signals, are electrically connected to source electrodes of the respective TFTs 30. The image signals S1, S2, . . . and Sn may be supplied to the respective data lines 6a in this order. Alternatively, the image signals S1, S2, . . . and Sn may be classified into groups. In this case, the image signals of each group are supplied to the respective data lines 6a adjacent to each other at a time that varies depending on the group.

Gate electrodes of the TFTs 30 are electrically connected to the respective scanning lines 3a. The electro-optical panel 100 is configured so that scanning signals G1, G2, . . . and Gm are applied to the respective scanning lines 3a in this order in a pulse-like manner. The pixel electrodes 9a are electrically connected to drain electrodes of the respective TFTs 30. The image signals S1, S2, . . . and Sn supplied from the data lines 6a are written at predetermined times by closing the TFTs 30 (switching elements) for a constant period. The image signals S1, S2, . . . and Sn having predetermined levels are maintained for a constant period so that the liquid crystal becomes oriented in a certain direction between the pixel electrodes 9a and the opposing electrodes 21.

Orientations and alignments of molecules contained in the liquid crystal (that forms the liquid crystal layer 50 (refer to FIG. 2)) are changed on the basis of applied voltage levels so that the liquid crystal modulates light and allow an image having multiple gradation levels to be displayed. In a normally white mode, transmittance of incident light is reduced on the basis of voltages applied to the respective pixels. In a normally black mode, the transmittance of the incident light is increased on the basis of voltages applied to the respective pixels. The electro-optical device outputs light having an intensity (or intensities) based on the image signals.

Storage capacitors 70 are provided to prevent the maintained image signals from leaking. The storage capacitors 70 are connected in parallel to respective liquid crystal capacitors. The liquid crystal capacitors are formed between the respective pixel electrodes 9a and the respective opposing electrodes (refer to FIG. 2). The storage capacitors 70 are storage elements and temporarily store potentials of the respective pixel electrodes 9a on the basis of the supplied image signals. One side electrodes of the storage capacitors 70 are connected parallel to the respective pixel electrodes 9a and electrically connected to the drain electrodes of the respective TFTs 30. The other side electrodes of the storage capacitors 70 are electrically connected to capacitor lines 300 (whose potentials are constant) so that the potentials of the other electrodes are constant. The storage capacitors 70 improve potential retention properties of the pixel electrodes 9a and display characteristics (improvement of contrast and reduction of flicker effects).

Figure 4:
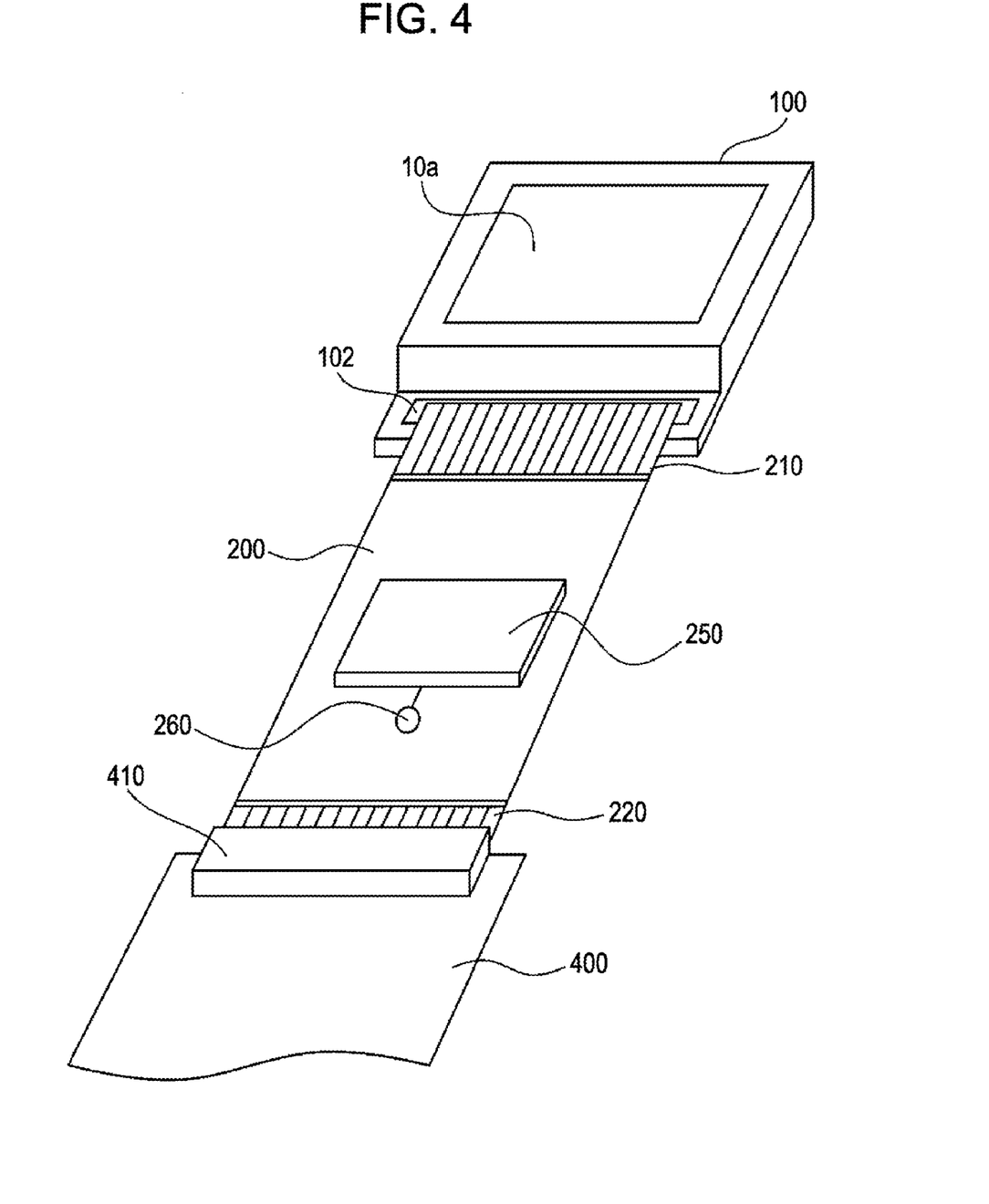
FIG. 4 is a perspective view of the entire configuration of an electro-optical device according to the embodiment.

Next, the entire configuration of the electro-optical device having the electro-optical panel and the flexible substrate (connected to the electro-optical panel) is described with reference to FIG. 4. FIG. 4 is a perspective view of the entire configuration of the electro-optical device according to the embodiment. The details of elements (shown in FIGS. 1 and 2) included in the electro-optical panel 100 are not illustrated in FIG. 4.

As shown in FIG. 4, the electro-optical device according to the embodiment includes the electro-optical panel 100 and the flexible substrate 200.

The flexible substrate 200 includes a connection terminal 210 that is connected to the external circuit connection terminal 102 (included in the electro-optical panel 100) by thermocompression bonding or the like.

The flexible substrate 200 is electrically connected to an external circuit substrate 400 that is located on the opposite side of the electro-optical panel 100 with respect to the flexible substrate 200. The flexible substrate 200 and the circuit substrate 400 are connected to each other by connecting a connection terminal 220 included in the flexible substrate 200 with a connector 410 included in the circuit substrate 400.

During an operation of the electro-optical device, signals (such as the image signals) are supplied from the circuit substrate 400 through the flexible substrate to the electro-optical panel 100. Details of configurations and operations of the flexible substrate 200 are described below.

Flexible Substrate

Next, the flexible substrate according to the embodiment is described with reference to FIGS. 4 to 7.

Referring to FIG. 4, the flexible substrate 200 according to the embodiment includes the connection terminals 210 and 220 located on respective ends of the flexible substrate 200. The flexible substrate 200 has an integrated circuit 250 on its surface. The integrated circuit 250 is formed on the flexible substrate 200 by tape automated bonding or the like. The integrated circuit 250 serves as a driving circuit for the electro-optical device. The integrated circuit 250 performs processing (such as correction and conversion) on an image signal input to the flexible substrate 200 and then outputs the processed signal. The integrated circuit 250 may include the data line driving circuit 101 and the scanning line driving circuit 104.

The flexible substrate 200 according to the embodiment includes an inspection electrode 260 on its surface. The inspection electrode 260 monitors the signal processed in the integrated circuit 250. The flexible substrate 200 may include a plurality of the inspection electrodes 260. The inspection electrode 260 may be formed on the other surface (opposite to the surface on which the integrated circuit 250 is formed) of the flexible substrate 200.

Figure 5:
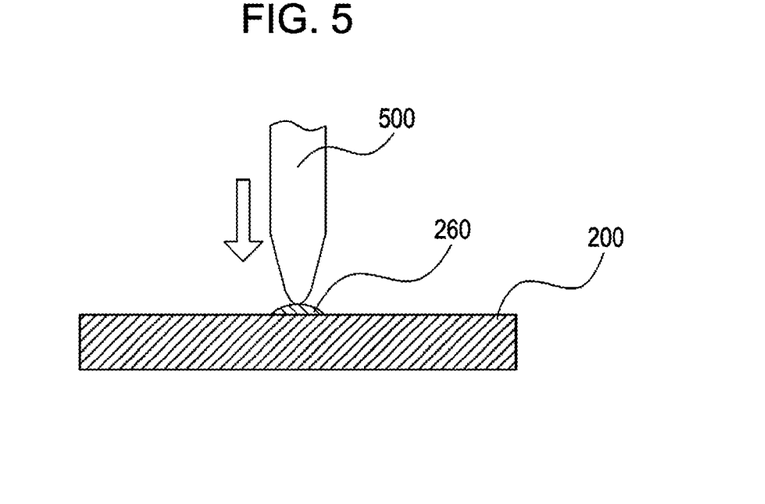
FIG. 5 is a side view of a flexible substrate to explain a method for reading a signal output from an inspection electrode.
Figure 6:
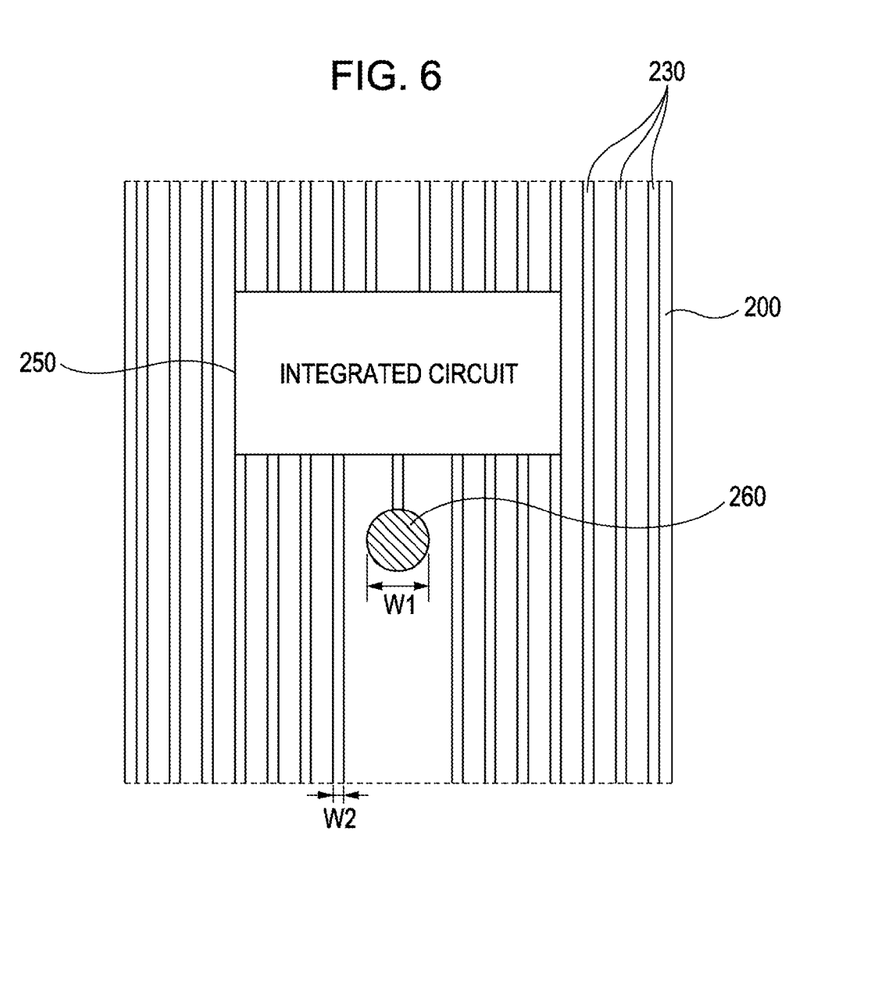
FIG. 6 is a plan view of the flexible substrate, showing the width of the inspection electrode and the widths of lines.
Figure 7:
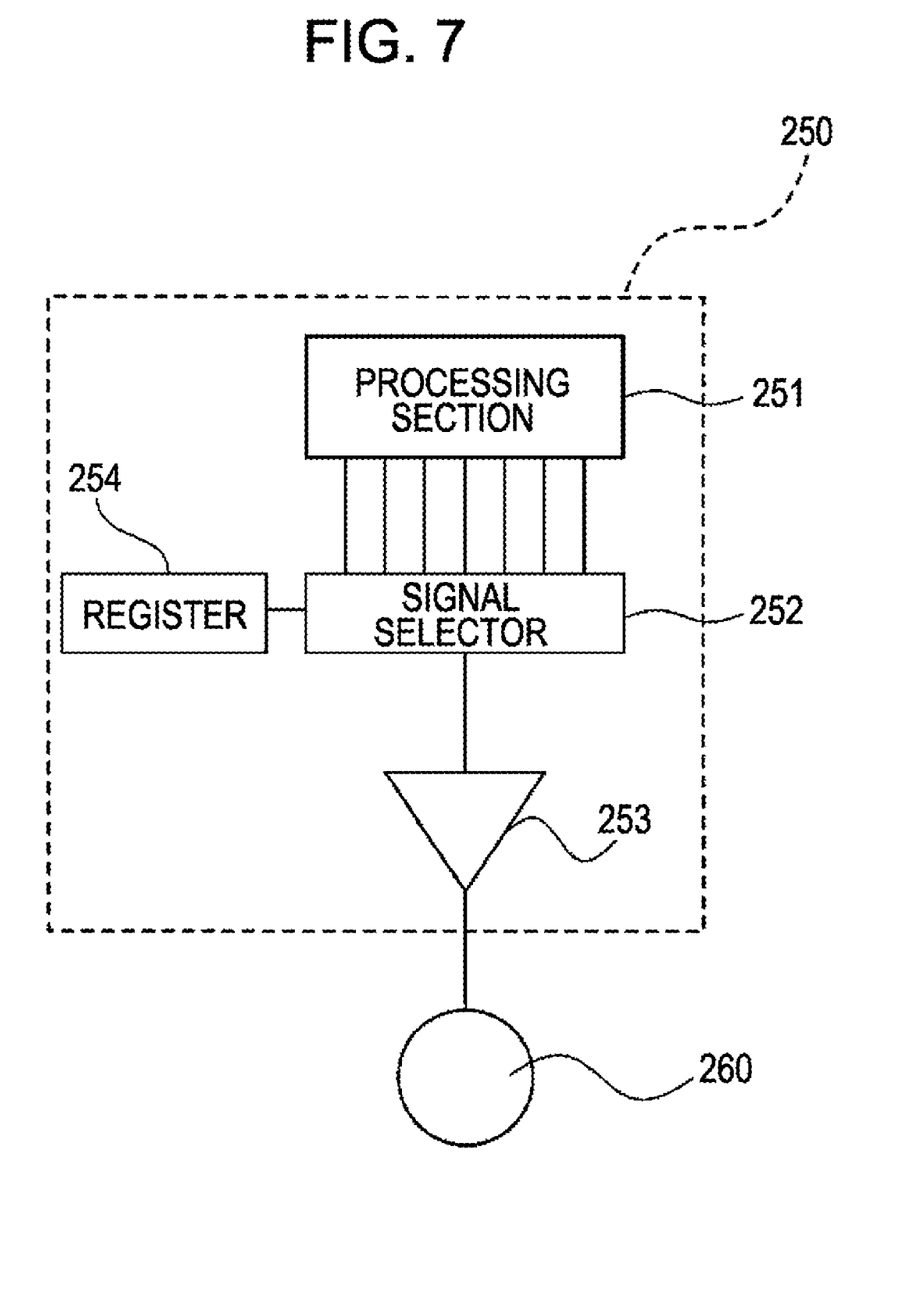
FIG. 7 is a block diagram showing a detail configuration of an integrated circuit.

Next, a function of the inspection electrode 260 is described in detail with reference to FIGS. 5 to 7. FIG. 5 is a side view of the flexible substrate 200 to explain a method for reading a signal output from the inspection electrode 260. FIG. 6 is a plan view of the flexible substrate 200, showing the width of the inspection electrode 260 and the widths of lines. FIG. 7 is a block diagram of the integrated circuit 250. In FIGS. 5 and 6, the elements are enlarged at different scales for convenience.

As shown in FIG. 5, the inspection electrode 260 is located on the surface of the flexible substrate 200. A reading probe 500 shown in, for example, FIG. 5 comes into contact with the inspection electrode 260 to read a signal output from the inspection electrode 260. The inspection electrode 260 has a convex shape as shown in FIG. 5. The inspection electrode 260, however, may have another shape as long as the inspection electrode 260 is capable of outputting a signal.

The inspection electrode 260 is capable of outputting signals (such as a clock signal, a start signal and a timing signal) in order to drive the electro-optical device. The inspection electrode 260 may output a signal (that is not output from the flexible substrate 200) used only for the internal processing of the integrated circuit 250. The signal that is not output from the flexible substrate 200 cannot be monitored even if an inspection terminal is provided on the electro-optical panel 100 or the circuit substrate 400 (refer to FIG. 4). When the signal used for the internal processing can be output from the flexible substrate 200, the function of the inspection electrode 260 is effectively performed.

As shown in FIG. 6, the width W1 of the inspection electrode 260 according to the embodiment is larger than the width W2 of each of the lines located on the flexible substrate 200. A signal can be more easily read from the inspection electrode 260 than reading of signals from the lines 230 that are formed on the flexible substrate 200 and exposed to the outside of the flexible substrate 200. Specifically, the probe 500 shown in FIG. 5 or the like easily comes into contact with the inspection electrode 260. Thus, the signal monitoring can be appropriately performed.

The inspection electrode 260 may have a shape that fits the reading probe 500 or the like, while the width of the inspection electrode 260 is large. In this case, a signal can be more easily read from the inspection electrode 260.

Referring to FIG. 7, the integrated circuit 250 formed on the flexible substrate 200 includes a processing section 251, a signal selector 252, an amplifier circuit 253 and a register 254.

The processing section 251 forms a main part of the integrated circuit 250. The processing section 251 performs various types of processing on input signals and outputs the processed signals in order to drive the electro-optical device. The processing section 251 outputs, to the signal selector 252, the signals that are to be output to the inspection electrode 260.

The signal selector 252 selects one signal from the signals output from the processing section 251. The signal selector 252 outputs the selected signal to the amplifier circuit 253. The signal selector 252 may be configured so that when the signal selector 252 does not select any signal from the signals, the signal selector 252 does not output a signal. The signal selector 252 is an example of first and second switching sections according to the invention.

The amplifier circuit 253 is an example of an amplifier according to the invention. The amplifier circuit 253 receives the signal from the signal selector 252 and amplifies the received signal. After that, the amplifier circuit 253 outputs the amplified signal to the inspection electrode 260. Even when the signal has small amplitude, the amplifier circuit 253 outputs the amplified signal having large amplitude to the inspection electrode 260. Thus, a signal that is difficult to be read without amplification can be reliably inspected.

The register 254 is a storage element and stores setting values for the integrated circuit 250. The setting values can be rewritten by an external device. The register 254 transmits a signal to the signal selector 252 on the basis of the stored setting values. The signal selector 252 selects a signal on the basis of the signal transmitted by the register 254. Thus, the register 254 can serve as a controller that controls the signal selector 252.

As described above, the flexible substrate 200 according to the embodiment is capable of appropriately monitoring a signal processed in the integrated circuit 250. The flexible substrate 200 is capable of appropriately inspecting the integrated circuit 250. Therefore, a highly reliable device can be easily manufactured.

Electronic Device

Figure 8:
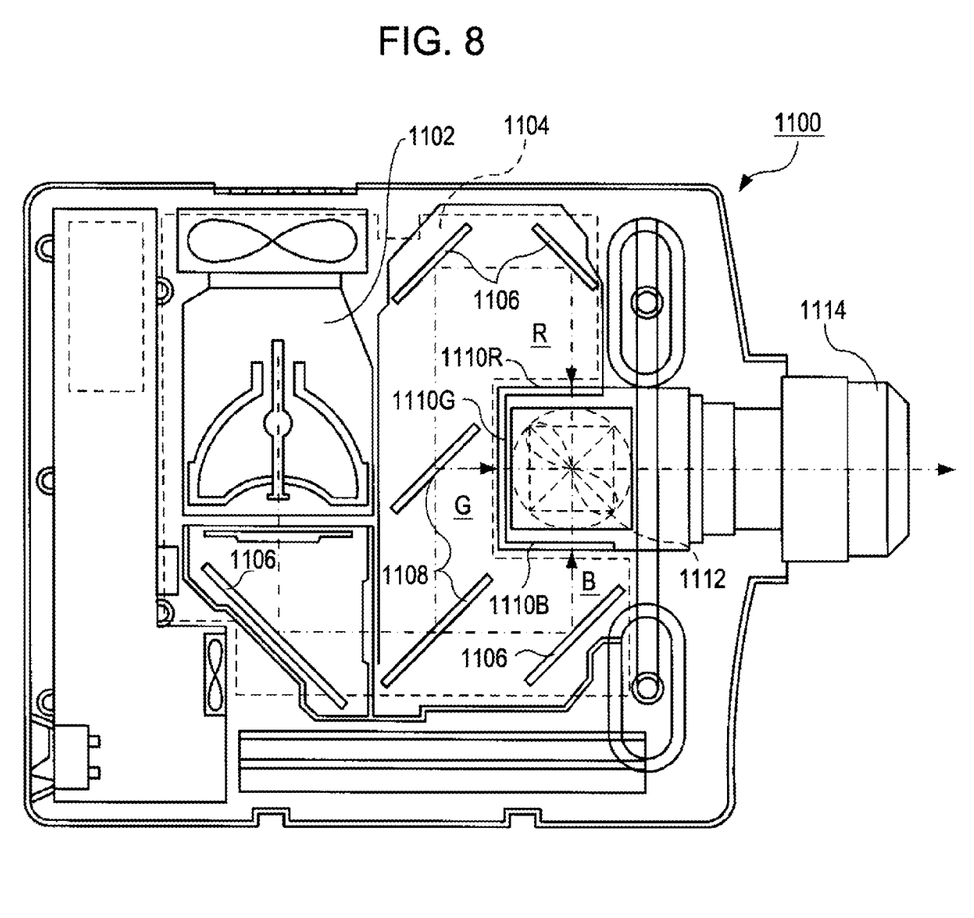
FIG. 8 is a plan view of a projector that is an example of an electronic device including the electro-optical device.

Next, electronic devices, each of which has the electro-optical device including the flexible substrate, are described. FIG. 8 is a plan view of a projector that serves as one of the electronic devices. The projector 1100 includes a liquid crystal device (that is an example of the electro-optical device) as a light bulb.

As shown in FIG. 8, the projector 1100 has a lamp unit 1102 therein. The lamp unit 1102 includes a white light source such as a halogen lamp. Light emitted by the lamp unit 1102 is divided into light components of three colors (red, green and blue colors) by four mirrors 1106 and two dichroic mirrors 1108. The mirrors 1106 and the dichroic mirrors 1108 are included in a light guide 104. The red, green and blue light components are incident on respective liquid crystal panels 1110R, 1110G and 1110B that serve as light bulbs.

Each of the liquid crystal panels 1110R, 1110G and 1110B has the same configuration as the liquid crystal device. The liquid crystal panels 1110R, 1110G and 1110B are driven by means of respective signals (of red, green and blue colors) supplied from an image signal processing circuit. The light components are modulated by the liquid crystal panels 1110R, 1110G and 1110B and then incident on a dichroic prism 1112 from three directions. The red and blue light components are refracted by the dichroic prism 1112 so that the directions of propagations of the red and blue light components are changed 90 degrees, while the green light component propagates straight through the dichroic prism 1112. Therefore, images of the colors are combined with each other. As a result, the combined color image is projected onto a screen through a projection lens 114.

It is necessary that the image formed on the liquid crystal panel 1110G be reversed left to right without reversal of the images formed on the liquid crystal panels 1110R and 1110B.

The red and green light components are incident on the liquid crystal panels 1110R and 1110G through the dichroic mirrors 1108. The blue light component is incident on the liquid crystal panels 1110B through one of the dichroic mirrors 1108. Thus, a color filter is not required for each of the liquid crystal panels 1110R, 1110G and 1110B.

The electronic device described with reference to FIG. 8 may be any of the following devices: a mobile personal computer; a mobile phone; a liquid crystal television; a viewfinder type video tape recorder; a monitor-direct-vision type video tape recorder; a car navigation system; a pager; an electronic notebook; a calculator; a word processor; a work station; a video phone; a POS terminal; a device having a touch panel; and the like.

In addition to the liquid crystal device described in the embodiment, the invention is applicable to a reflective liquid crystal device, a liquid crystal on silicon device, a plasma display, a field emission display, an organic electroluminescence display, an electrophoresis device or the like.

The invention is not limited to the above embodiments, and various changes and modifications may be made in the aforementioned embodiment without departing from the gist and spirit of the invention. The changed or modified flexible substrate, the changed or modified electro-optical device and the changed or modified electronic device are included in the scope of the invention.

The entire disclosure of Japanese Patent Application No. 2009-069825, filed Mar. 23, 2009 is expressly incorporated by reference herein.

What is claimed is:

1. A flexible substrate comprising:
    a substrate body;
    a plurality of lines that are arranged on the substrate body;
    a plurality of connection terminals that are arranged on an end portion of the substrate body and electrically connected to the respective lines;
    an integrated circuit that is arranged on the substrate body and electrically connected to at least one of the lines;
    an inspection electrode that is arranged on the substrate body and electrically connected to the integrated circuit and capable of outputting a signal processed in the integrated circuit, and
    a switching section that switches an operation of the inspection electrode on/off to cause the inspection electrode to output or not to output the signal processed in the integrated circuit.

2. The flexible substrate according to claim 1, wherein the inspection electrode outputs a signal that is not input to or output from the integrated circuit through the plurality of connection terminals.

3. The flexible substrate according to claim 1, wherein the switching section that switches the types of signals that are to be output from the inspection electrode.

4. The flexible substrate according to claim 1 further comprising:
    an amplifier that amplifies a signal that is to be output to the inspection electrode.

5. The flexible substrate according to claim 1, wherein the inspection electrode has a width larger than the widths of the lines.

6. An electro-optical device comprising:
the flexible substrate according to any of claims 1, 2, or 3-5 and;
an electro-optical panel that is electrically connected to the flexible substrate through the connection terminals.

7. An electronic device comprising the electro-optical device according to claim 6.

8. A flexible substrate comprising:
a substrate body;
a plurality of lines that are arranged on the substrate body;
a plurality of connection terminals that are arranged on an end portion of the substrate body and electrically connected to the respective lines;
an integrated circuit that is arranged on the substrate body and electrically connected to at least one of the lines;
an inspection electrode that is arranged on the substrate body and electrically connected to the integrated circuit and capable of outputting a signal processed in the integrated circuit, and
a switching section that switches the types of signals that are to be output from the inspection electrode.

9. A flexible substrate comprising:
a substrate body;
a plurality of wirings that are arranged on the substrate body;
a plurality of connection terminals that electrically connects a device and at least one of the plurality of wirings;
an inspection electrode that is arranged on the substrate body, the inspection electrode electrically connecting to an integrated circuit, the inspection electrode being capable of outputting a signal processed by the integrated circuit; and
a switching section that switches types of the signal, are to be outputted from the inspection electrode,
the inspection electrode being disposed between one of the plurality of wirings and another one of the plurality of wirings, wherein the integrated circuit is electrically connected to at least one of the plurality of wirings.

10. A flexible substrate comprising:
a substrate body;
a plurality of wirings that are arranged on the substrate body;
a plurality of connection terminals that electrically connect a device and at least one of the plurality of wirings; and
an inspection electrode that is arranged on the substrate body, the inspection electrode electrically connecting to an integrated circuit, the inspection electrode being capable of outputting a signal processed by the integrated circuit,
the inspection electrode being disposed between one of the plurality of wirings and another one of the plurality of wirings, wherein the integrated circuit is electrically connected to at least one of the plurality of wirings.

11. An electro-optical device comprising:
the flexible substrate according to claim 10; and
an electro-optical panel that is electrically connected to the flexible substrate via at least one of the plurality of connection terminals.

12. An electronic device comprising the electro-optical device according to claim 11.

* * * * *